United States Patent
Soares et al.

(10) Patent No.: US 10,554,199 B2
(45) Date of Patent: Feb. 4, 2020

(54) MULTI-STAGE OSCILLATOR WITH CURRENT VOLTAGE CONVERTERS

(71) Applicants: Marshall Soares, Taylorsville, UT (US); Richard N. Rea, Lehi, UT (US)

(72) Inventors: Marshall Soares, Taylorsville, UT (US); Richard N. Rea, Lehi, UT (US)

(73) Assignee: Hall Labs LLC, Provo, UT (US)

(*) Notice: Subject to any disclaimer, the term of this patent is extended or adjusted under 35 U.S.C. 154(b) by 106 days.

(21) Appl. No.: 15/718,841

(22) Filed: Sep. 28, 2017

(65) Prior Publication Data
US 2019/0097577 A1    Mar. 28, 2019

(51) Int. Cl.
| H03K 3/03 | (2006.01) |
| H03K 3/354 | (2006.01) |
| H03K 3/011 | (2006.01) |
| H03K 3/012 | (2006.01) |
| H03K 3/013 | (2006.01) |

(52) U.S. Cl.
CPC ............ *H03K 3/0315* (2013.01); *H03K 3/354* (2013.01); *H03K 3/011* (2013.01); *H03K 3/012* (2013.01); *H03K 3/013* (2013.01)

(58) Field of Classification Search
CPC ...... H03K 3/0315; H03K 3/354; H03K 3/011; H03K 3/012; H03L 7/0995
See application file for complete search history.

(56) References Cited

U.S. PATENT DOCUMENTS

| 7,560,998 B2* | 7/2009 | Ohta .................... H03K 3/0315 331/176 |
| 2010/0149137 A1* | 6/2010 | Saito ................... H03K 3/0315 345/204 |

* cited by examiner

*Primary Examiner* — Ryan Johnson

(57) ABSTRACT

A current-mode, multi-stage oscillator converts an oscillating current to an oscillating voltage using one or more current voltage converters on one or more of the output stages of the multi-stage oscillator. The use of current voltage convertors transforms the low output swing (e.g., transistor threshold limited) of the oscillator into a rail-to-rail voltage oscillation with minimal jitter and operational stability over a wide temperature range.

19 Claims, 9 Drawing Sheets

MULTI-STAGE OSCILLATOR WITH CURRENT VOLTAGE CONVERTERS

BACKGROUND OF THE INVENTION

1. Field of the Invention

The present invention relates generally to the field of electronic circuits and more specifically relates to systems and methods for generating frequencies.

2. Related Art

Oscillators are typically used to convert a DC input (the control current or voltage) into an AC output (the waveform), which can have a wide range of different wave shapes and frequencies that can be either complicated in nature or simple sine waves depending upon the application.

Oscillators are also used in many pieces of test equipment producing either sinusoidal sine waves, square, saw tooth or triangular shaped waveforms or even a train of pulses having a variable or constant width. An oscillator is basically an amplifier with "positive feedback," or regenerative feedback (in-phase).

Voltage or current controlled oscillators are often used to generate frequencies in complementary metal-oxide-semiconductor (CMOS) circuits. The generated frequencies are used in synthesizers, communication, including radio frequency (RF) and digital, frequency multiplication, and other applications. In some cases, the frequencies are used as part of a phase-locked loop (PLL) or delay-locked loop (DLL) circuit. In all of these applications, the ability to tune an output frequency (and often the output phase) is typically provided.

Those skilled in the art will recognize that there are many types of oscillators used to generate frequencies including crystal oscillators, inductor-capacitor (LC) oscillators, Colpitts oscillators, Hartley oscillators, etc. Many voltage-controlled CMOS oscillators are implemented using a current starved inverter, single-ended amplifiers, or differential amplifiers.

All of these oscillators will generally have widely varying performance over the processing corners and temperature and all are generally dependent on the voltage amplification of the devices, which may vary with processing and with the ambient temperature. The number of stages varies from two to N for most oscillators and the oscillators will generally use a combination of phase shift and inversion of the stages to generate a frequency that is dependent upon the voltage gain in each separate stage.

While many presently known oscillators are suitable for certain applications, the dependencies associated with temperature variation and voltage amplification make it somewhat difficult to generate the appropriate frequencies for certain applications. Accordingly, without creating additional systems and methods for frequency generation over a wider range of ambient temperature and voltages, frequency generation will continue to be sub-optimal.

SUMMARY OF THE INVENTION

The present invention provides for a current-mode oscillator solution that is far less susceptible to process and temperature variations than the current methods used for frequency generation. Further, in the most preferred embodiments of the present invention, noise immunity is increased, and thus jitter (e.g., phase or timing) is reduced. By converting an oscillating current to an oscillating voltage using two or more transistors, enhanced performance over the current state-of-the-art can be realized. The proposed current-mode solution is much less susceptible to voltage and temperature variations than the prior art methods and supply voltage fluctuations are significantly less likely to induce jitter.

The most preferred embodiments of the present invention overcome the limitations associated with process and temperature variation. The use of an amplifier, and a current voltage (IV) converter on the output stages in a ring oscillator transforms the low output swing (e.g., transistor threshold limited) of the oscillator into a rail-to-rail voltage oscillation. Finally, the most preferred embodiments of the present invention convert an oscillating current to an oscillating voltage using a plurality of transistors configured as a current to voltage converter.

The most preferred embodiments of the present invention successfully decrease the oscillator output dependency upon voltage and temperature. Additionally, the temperature range of operation is increased to relatively extreme values. The use of current-mode oscillation with current control allows very high impedance to either the power rail or the ground rail. Thus, the most preferred embodiments of the present invention exhibit a relatively high rejection of power supply noise.

BRIEF DESCRIPTION OF THE SEVERAL VIEWS OF THE DRAWINGS

The preferred embodiments of the present invention will hereinafter be described in conjunction with the appended drawings, wherein like designations denote like elements.

DETAILED DESCRIPTION OF THE INVENTION

The present invention provides for a current-mode oscillator solution that is far less susceptible to process and temperature variations than the current methods used for frequency generation. Further, in the most preferred embodiments of the present invention, noise immunity is increased, and thus jitter (e.g., phase or timing) is reduced. By converting an oscillating current to an oscillating voltage using two or more transistors, enhanced performance over the current state-of-the-art can be realized. The proposed current-mode solution is much less susceptible to voltage and temperature variations than the prior art methods and supply voltage fluctuations are significantly less likely to induce jitter.

The most preferred embodiments of the present invention overcome the limitations associated with process and temperature variation. The use of an current mirror amplifier, and an IV comparator on the output stages in a ring oscillator transforms the low output swing (e.g., transistor threshold limited) of the oscillator into a rail-to-rail oscillation. Finally, the most preferred embodiments of the present invention convert an oscillating current to an oscillating voltage using a plurality of transistors configured as a current voltage converter.

The most preferred embodiments of the present invention successfully decrease the oscillator output dependency upon voltage and temperature. Additionally, the temperature range of operation is increased to relatively extreme values. The use of current-mode oscillation with current control allows very high impedance to either the power rail or the ground rail. Thus, the most preferred embodiments of the present invention exhibit a relatively high rejection of power supply noise.

Figure 1:
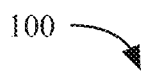
FIG. 1 is a schematic diagram for a prior art voltage mode controlled oscillator.
Figure 1:
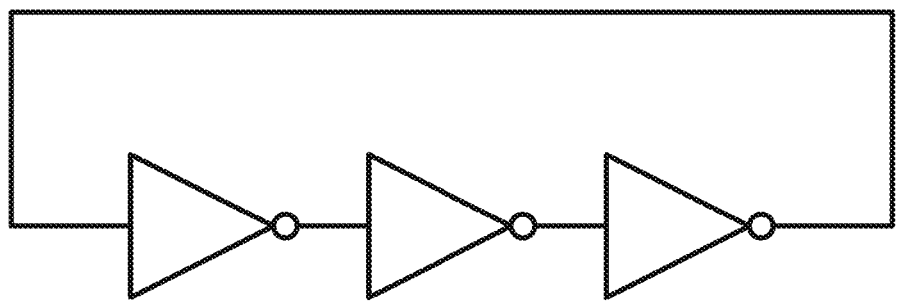

Referring now to FIG. 1, a circuit diagram for a prior art voltage mode controlled oscillator 100 is depicted. Oscillator 100 represents a three-stage oscillator but similar prior art oscillators may have two to N stages. These oscillators generally use a combination of phase shift and inversion of the stages to generate a voltage gain dependent frequency in each stage.

Figure 2:
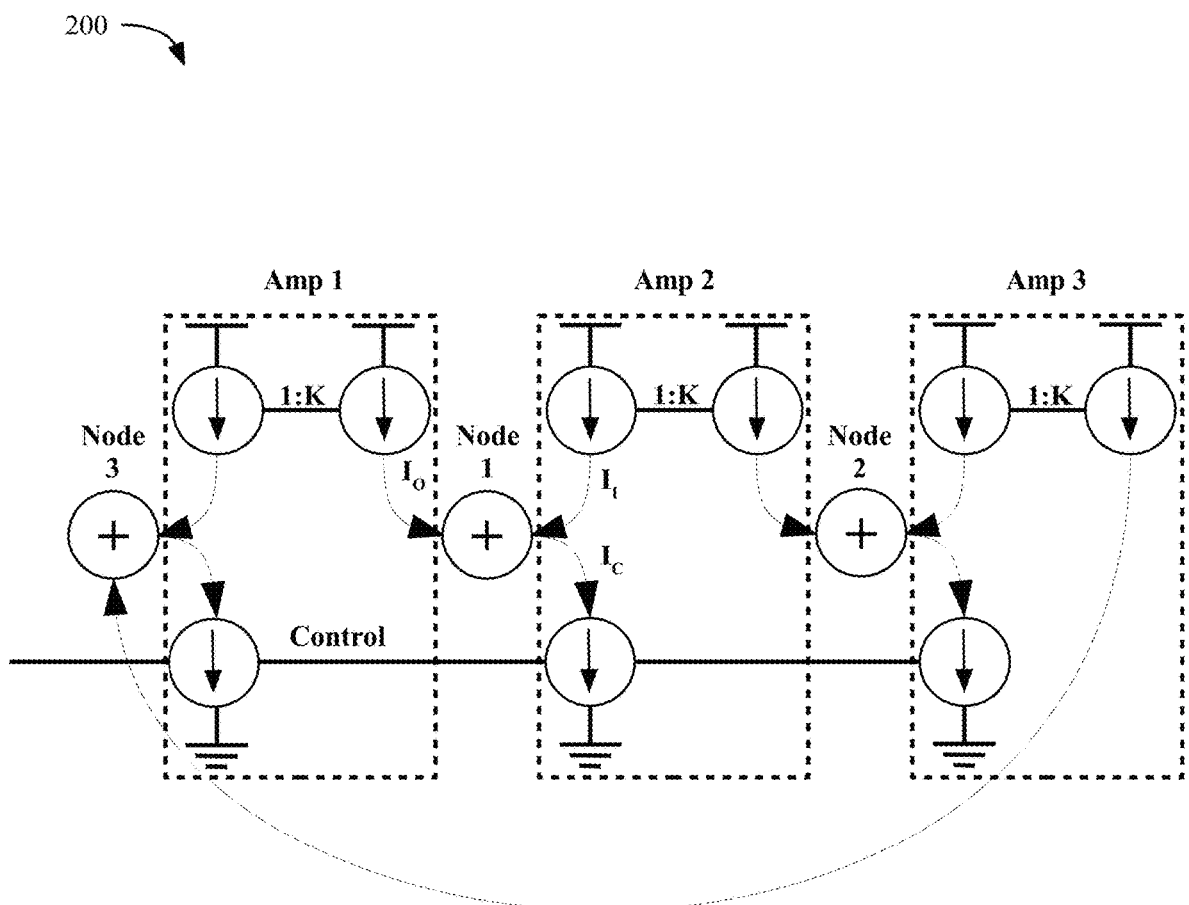
FIG. 2 is a circuit diagram for a current mode controlled oscillator in accordance with a preferred exemplary embodiment of the present invention.

Referring now to FIG. 2, a circuit diagram for a current mode controlled oscillator 200 in accordance with a preferred exemplary embodiment of the present invention is depicted. The disclosed invention uses the current gain of a current mirror to provide enough gain to oscillate. A sample of a three-stage oscillator in accordance with the most preferred embodiments of the present invention is shown in FIG. 2. The methods of the present invention are used primarily in conjunction with multi-stage oscillators having at least two stages of amplification. The oscillator of FIG. 2 used current mirrors amplifiers comprising P-Channel type transistors as described in conjunction with FIG. 3. An equivalent oscillator can be designed using the N-Channel type transistors of FIG. 4.

Each current mirror will generate K times the input current. This gain is not dependent, to the first order, on process or temperature.

The summing node negates the previous stages output current by changing the input current for the next stage. This current at the node is (one transistor stage of FIG. 6 for Example):

$$I_{M13}+I_{M2}-I_{M1}=0$$

Or if all amplifiers are equal, $$I_{M2}(K+1)-I_{M1}=0$$

$$I_{M2}=I_{CM1}/(K+1)$$

$$I_{M3}=(K/(K-1))I_{M1}$$

As previously mentioned, it is possible to have an oscillator that will not oscillate. The oscillation begins because the current mirror transistors are in the active region (high gain) and any disturbance will cause a circuit imbalance. The frequency of the oscillation is then determined by the capacitive load at each node and the control current. The load is determined by fixed parameters, either from stray capacitance or additional capacitive loads at each node. These capacitors vary with process but are affected very little by temperature. Any deviation of voltage at the summing node creates load current. This load current is then multiplied by K in the next stage, delayed by capacitive angle of the current.

$$I_{LOAD}=C^*(dv/dt)$$

Figure 3:
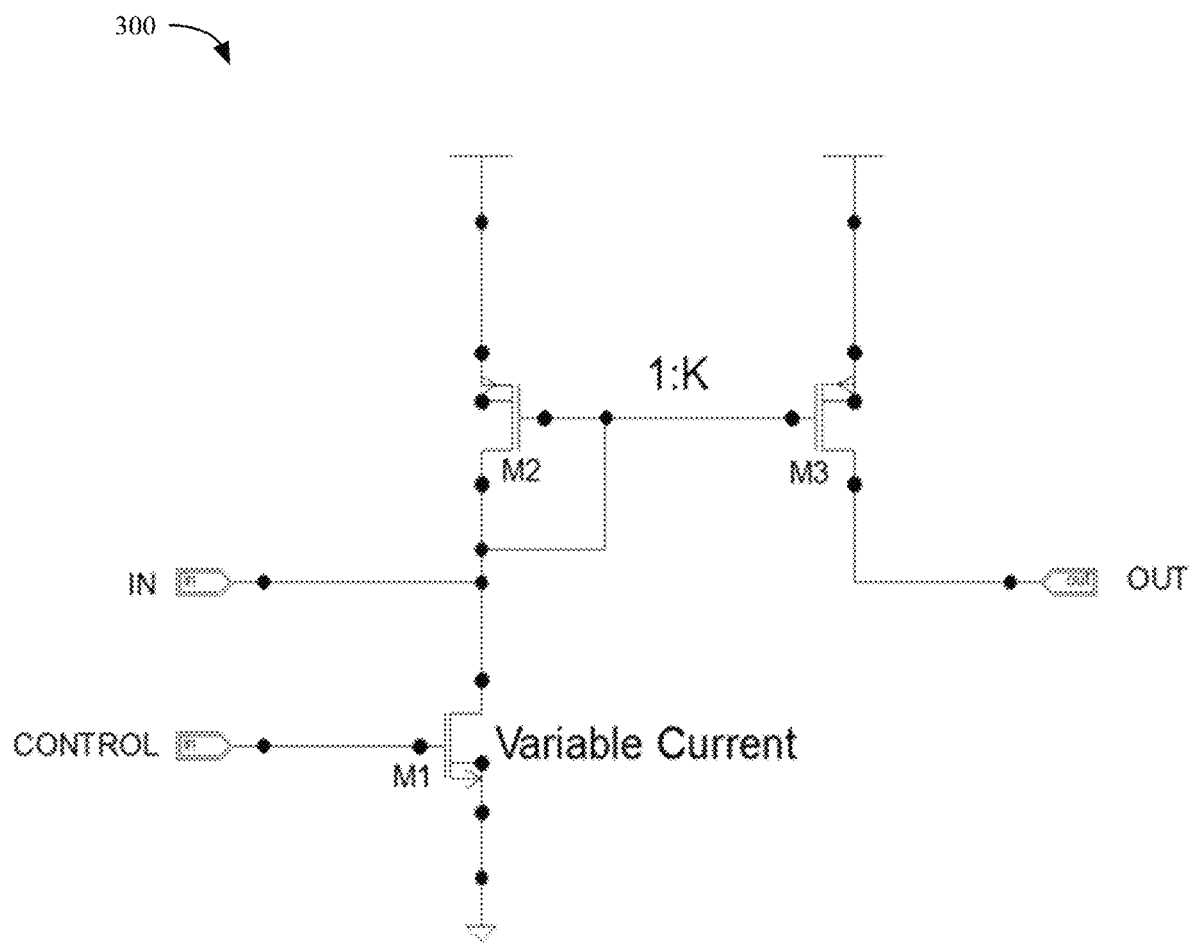
FIG. 3 is a circuit diagram of a P-channel mirror gain stage used in conjunction with a current mode controlled oscillator in accordance with a preferred exemplary embodiment of the present invention.
Figure 4:
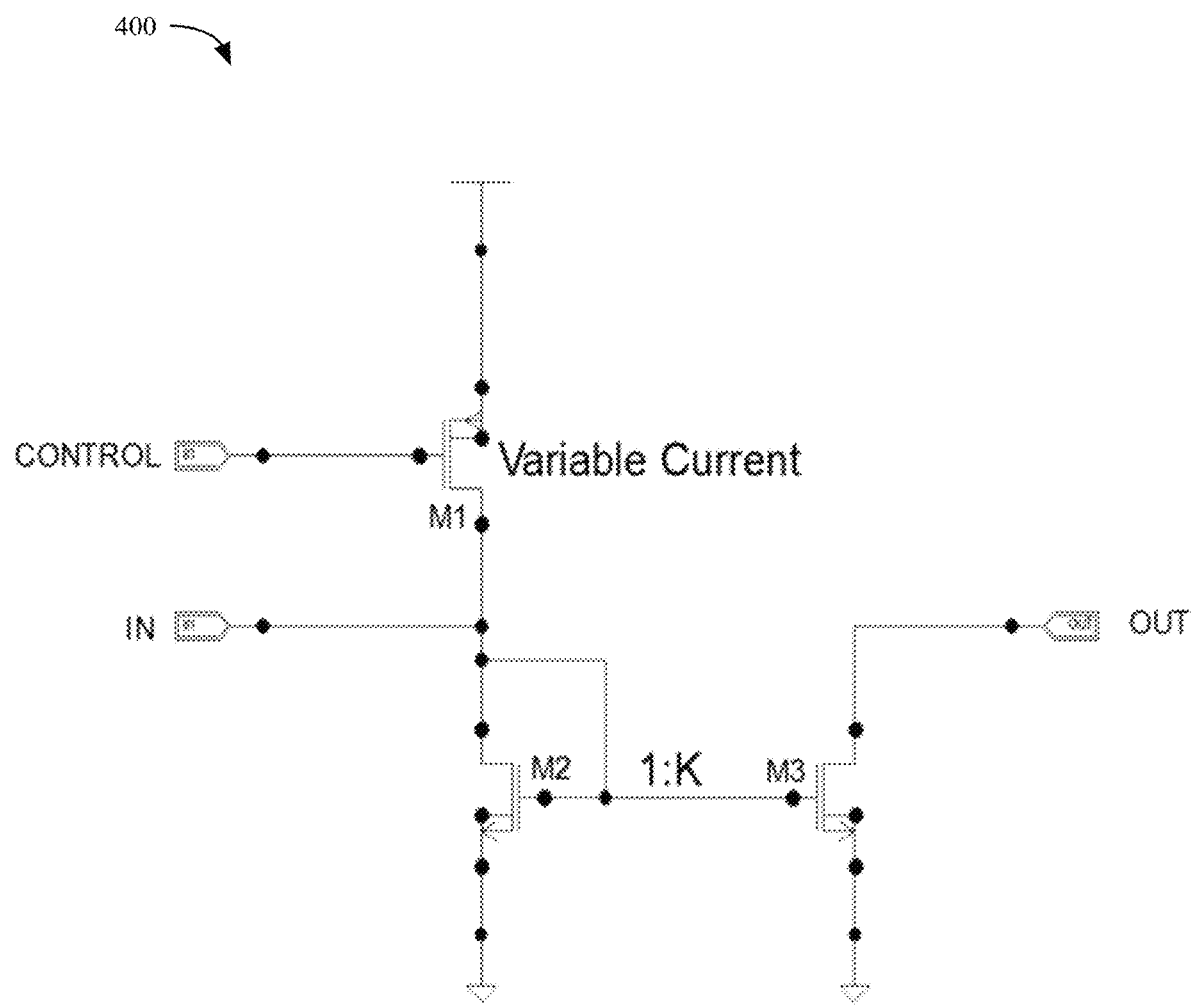
FIG. 4 is a circuit diagram of an N-channel mirror gain stage used in conjunction with a current mode controlled oscillator in accordance with a preferred exemplary embodiment of the present invention.

The oscillator can be implemented using with either P-Channel type stages, as shown in FIG. 3 or N-Channel type stages as shown in FIG. 4. In either case, the current mirror ratio of M2 and M3 are sized for a gain factor of K. The oscillator is guaranteed to start because these two transistors are in the active region when a fully balanced, non-oscillating condition is attempted.

During operation, M2 and M3 can be cutoff when the voltage rises on the node. When the current in the first stage rises, the current in the second stage decreases (and may even be cutoff), the current in the third stage increases, and finally this decreases the current in the first stage. The net effect is stable oscillation.

The frequency of operation in determined by the load current, ILOAD. This current subtracts from the output current available at each stage. A delta in the voltage necessary to change the current in the next stage means some current is required by the load. As the control current increases, the portion of the current used to charge and discharge the load decreases, and the frequency increases.

Referring now to FIG. 3, a circuit diagram of a P-channel mirror gain stage 300 used in conjunction with a current mode controlled oscillator in accordance with a preferred exemplary embodiment of the present invention is depicted.

Referring now to FIG. 4, a circuit diagram of an N-channel mirror gain stage 400 used in conjunction with a current mode controlled oscillator in accordance with a preferred exemplary embodiment of the present invention is depicted.

Figure 5:
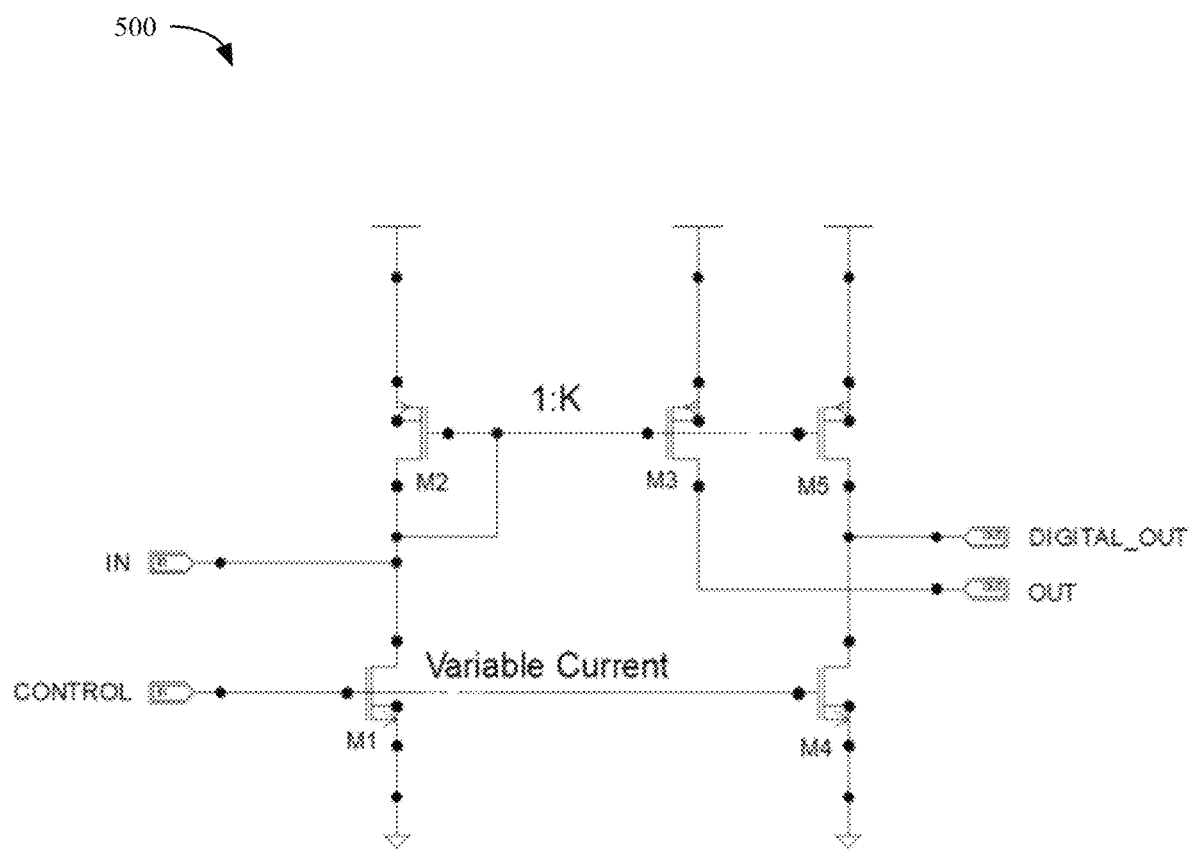
FIG. 5 is a circuit diagram of a P-channel mirror gain stage with digital output used in conjunction with a current mode controlled oscillator in accordance with a preferred exemplary embodiment of the present invention.

Referring now to FIG. 5, a circuit diagram 500 of a P-channel mirror gain stage with digital output used in conjunction with a current mode controlled oscillator in accordance with a preferred exemplary embodiment of the present invention is depicted.

Figure 6:
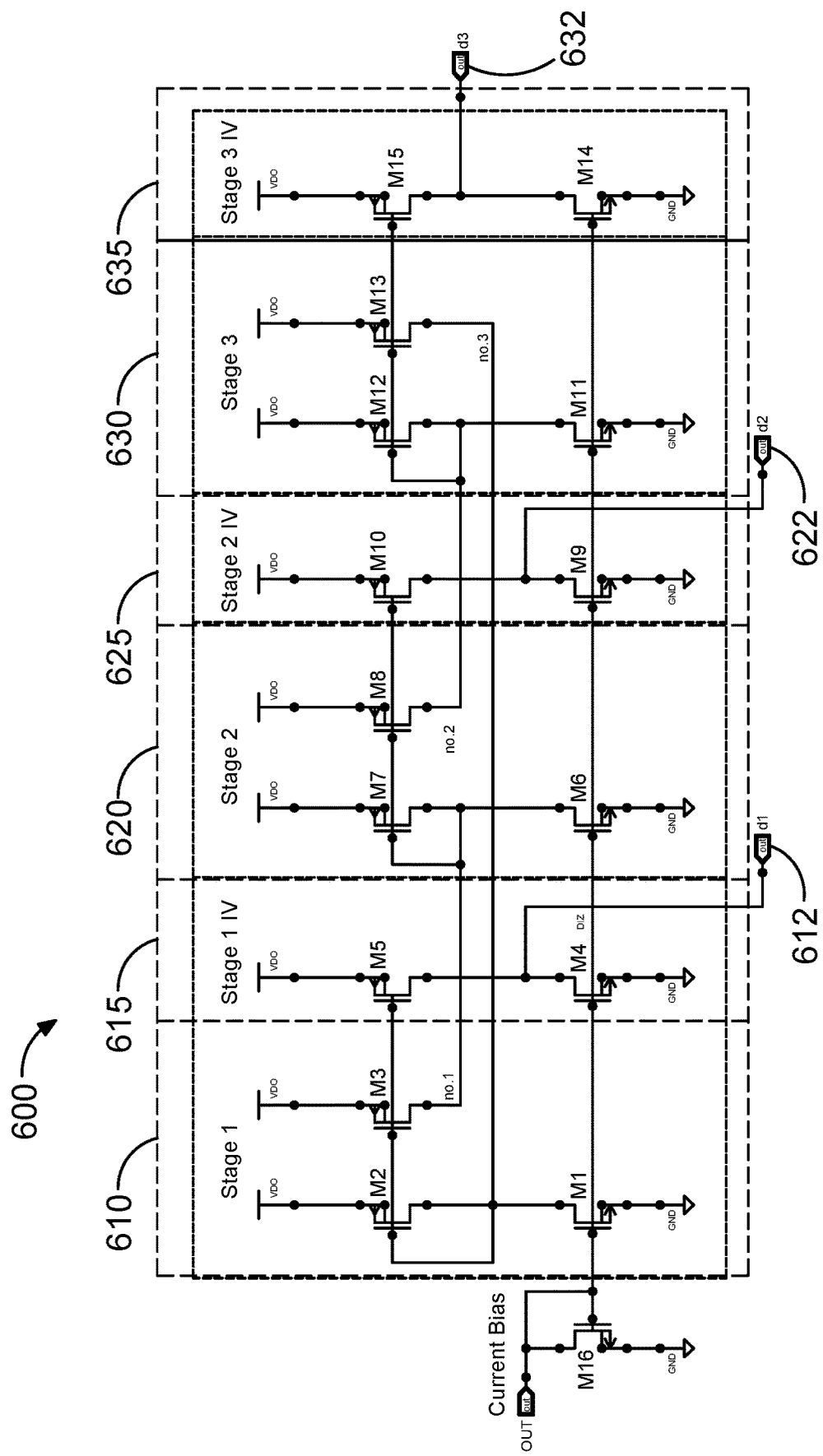
FIG. 6 is a schematic of a three-stage oscillator with three IV converters for generating frequencies using a current mode controlled oscillator in accordance with a preferred exemplary embodiment of the present invention.

Referring now to FIG. 6, a circuit diagram for a three-stage oscillator 600 for generating frequencies using a current mode controlled oscillator in accordance with a preferred exemplary embodiment of the present invention is depicted. As shown in FIG. 6, the most preferred embodiment of the present invention comprises three oscillator stages (610, 620, and 630), with a current voltage (IV) converter (615, 625, and 635) being coupled to the output of each of the three oscillator stages. It is sufficient to use only one IV converter, but using one per oscillator stage balances the loads on the oscillator stages.

The frequency of operation for oscillator 600 is largely determined by the control current mirrored from M16 to M1 and M4, and the output load capacitance on each oscillator stage node. Additionally, oscillator 600 provides three output connections 612, 622, and 632 for load balancing purposes.

In contrast to previously implemented multi-stage oscillator circuits, which have frequency-dependent output waveforms, the inclusion of current voltage converters 615, 625, and 635 as shown in FIG. 6 provides for an oscillator circuit with a relatively smooth output from rail-to-rail.

Without IC converters 615, 625, and 635, the oscillator stage output is potentially insufficient for lower frequencies and will be relatively weak (e.g., low amplitude) at higher frequencies.

The current gain stage provides gain, K, but sizing of the two p-channel devices, M2 and M3 for stage one. Therefore:

$$K=W_{M3}/W_{M2}$$

For K>2, the circuit without the IV converters, as is common in the prior art, is inherently unstable. For applications with a wide temperature range (e.g., −55 C to 300 C) it is more preferable to have K~≥3. This creates the output oscillations shown in FIG. 7 and FIG. 8 as the oscillator stage output. For these results, M is a positive number greater than 1 That amplifies the lower voltage swings of the current mode oscillator by converting current swings into voltage swings with sufficient gain to drive the output rail-to-rail.

The IV conversion accomplished by M4 and M5 for oscillator stage 610 converts the relatively low output current from oscillator stage 610 to a high impedance voltage output where M4 is a scaled output (L) of the control current. This configuration increases the output current, and tracks the control current, and thus allows the output swing current to drive the oscillator output rail-to-rail. Scaling factors are the key to operation, and are set by altering the width of the transistors. As discussed earlier, a factor of "K" is used to provide the oscillator gain as: $W_{M3}=K*W_{M2}$ The output waveform is not digital. Gain in the IV converter is provided by a second gain factor, M, for the IV converter. In this case, $W_{M4}=M*W_{M16}$ and $W_{M5}=N*(K+1)*W_{M2}$. M controls the output low-going slew rate into an external load, and N controls the output high-going slew rate into an external load. Adjusting M and N control the waveshape and duty cycle of the output.

The values for M1 through M3 are repeated for each oscillator stage 610, 620, and 630, and the values for M4 and M5 are repeated for each desired IV converter 615, 625, and 635. The output from each IV converter can be used directly, but it may be desirable to "square-up" the signal prior to use in certain application environments. A single inverter on the output of the IV converter serves this purpose. Samples of the converted output from an IV convertor in shown in FIG. 7 and FIG. 8, and represents the digital output from oscillator 600.

The three-stage oscillator design with three IV convertors shown in FIG. 6 can be extrapolated to create one or more n-stage oscillators, where n an odd integer. From one to n IV converters can be used within the ring. Thus, while this discussion focuses on the circuit of FIG. 6, those skilled in the art will recognize that the concepts set forth in the design of FIG. 6 will apply equally to an odd number long ring of oscillator stages, and any number of IV converters (e.g., the number of IV converters is any integer value from 1 to n). While it is possible to have n as an even integer, the performance of the resulting oscillator is likely to be less stable and less robust for various applications.

The application environment will typically inform other oscillator circuit design considerations. For example, the value for M and N can be selected based on the circuit load. In general, the larger the load, the larger the value of M and N. As the value of M and N increase, the output voltage will also increase and the power draw of the circuit will also increase. Correspondingly, the maximum frequency for oscillations will decrease. Accordingly, it is considered desirable for most applications to minimize M to the extent possible, while maintaining the capacity to drive the anticipated load.

The disclosed invention uses n-channel devices for the control current and p-channel devices to provide the gain. The circuit can just as easily be implemented with p-channel control current and n-channel gain.

Figure 7:
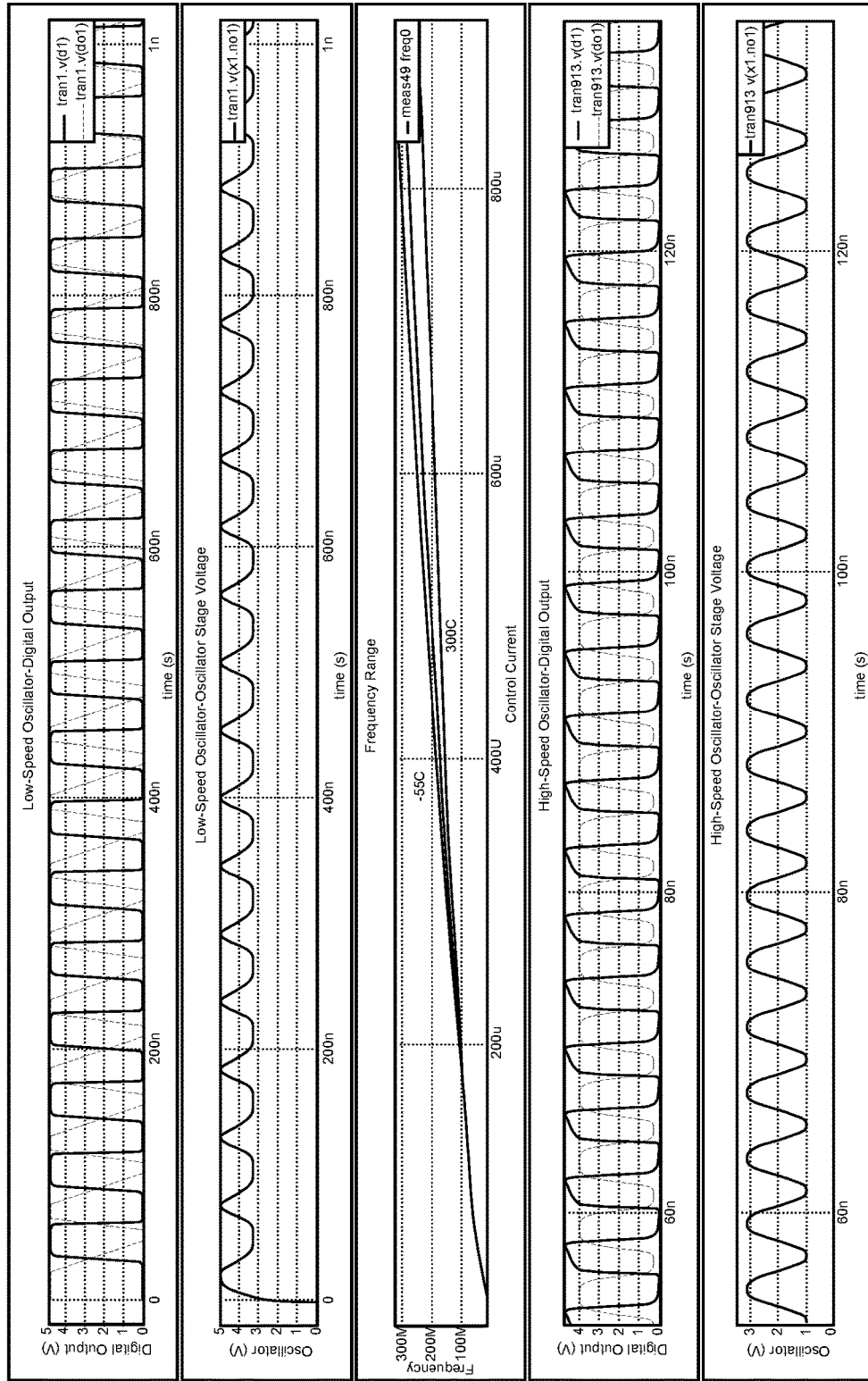
FIG. 7 is a series of graphs illustrating oscillator performance over a given temperature range for a current mode controlled oscillator in accordance with a preferred exemplary embodiment of the present invention.

Referring now to FIG. 7, a series of graphs illustrating oscillator performance over a given temperature range for a current mode controlled oscillator in accordance with a preferred exemplary embodiment of the present invention is depicted. The central plot of FIG. 7 illustrates the frequency variation that occurs when oscillator 600 is simulated at temperatures approximating $-55^C$, $25^C$, and $300^C$ over a control current range of 10 uA to 900 uA As shown in FIG. 7, the frequency value varies only ~17%. The frequency variation can be attributed to widely varying threshold voltages and increased imperfect operation of the current mirror itself over this relatively wide temperature range. The first and fourth plots of FIG. 7 illustrate clean rail-to-rail digital outputs, while the second and fifth plots clearly show the limited and varying voltage levels on the internal oscillator nodes. The first and second plots illustrate operation at very low frequencies while the fourth and fifth illustrate very high frequencies.

Figure 8:
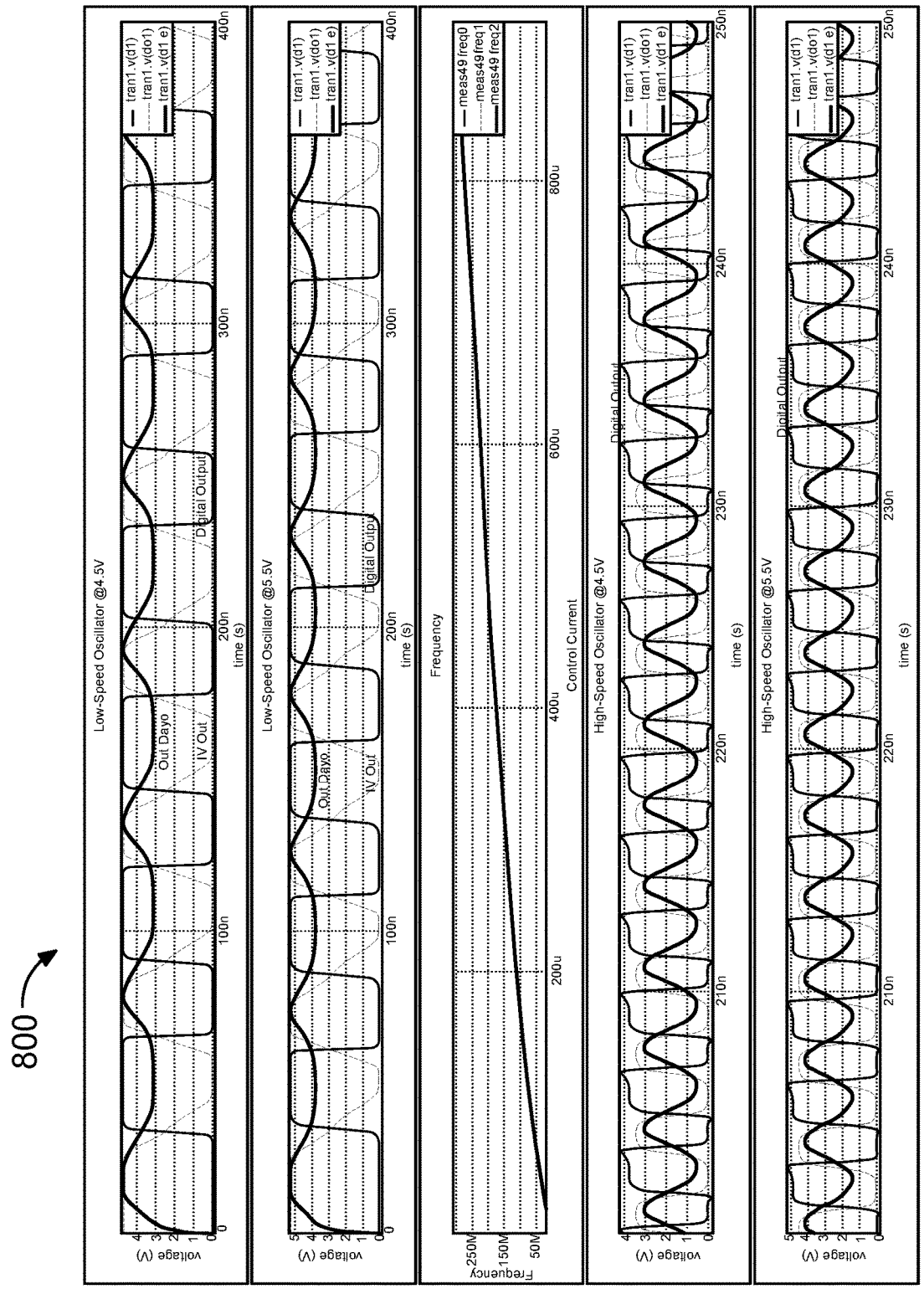
FIG. 8 is a series of graphs illustrating oscillator performance over a given voltage range for a current mode controlled oscillator in accordance with a preferred exemplary embodiment of the present invention.

Referring now to FIG. 8, a series of graphs illustrating oscillator performance over a given voltage range for a current mode controlled oscillator in accordance with a preferred exemplary embodiment of the present invention is depicted. FIG. 8 illustrates the frequency variation that occurs when oscillator 600 is simulated with a power supply providing 4.5 volts and 5.5 volts. As shown in FIG. 8, the frequency variation for oscillator 600 is less than 3%. This promises low jitter which can be very important for a wide variety of applications. The variation in frequency is shown in the third plot. Similar to FIG. 7, the first and second plots depict low frequency operation while the fourth and fifth depict high frequency operation.

Figure 9:
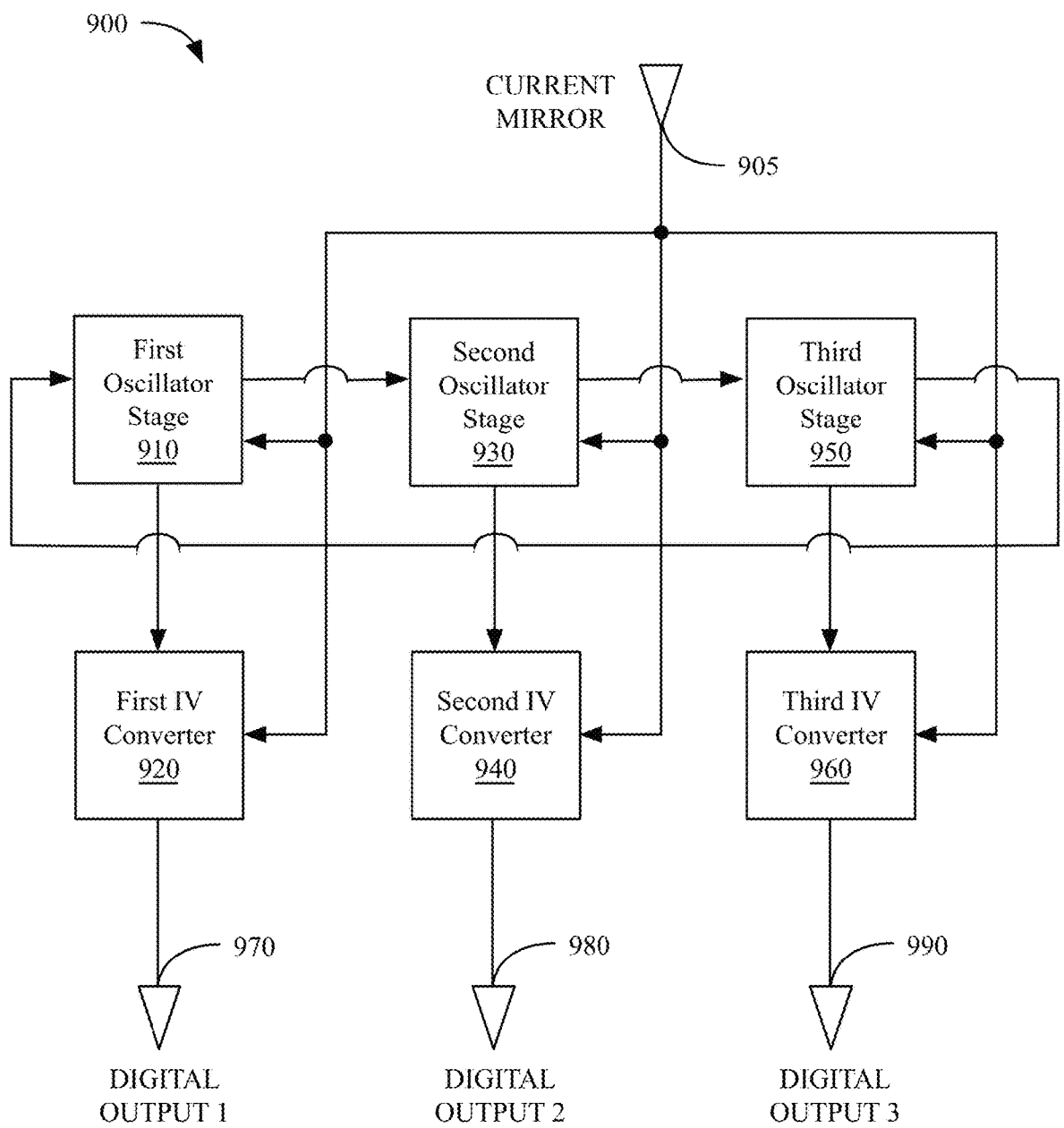
FIG. 9 is a block diagram of a three-stage oscillator with three IV converters for generating frequencies using a current mode controlled oscillator in accordance with a preferred exemplary embodiment of the present invention.

Referring now to FIG. 9, a block diagram of circuit 900 for implementing a three-stage oscillator with three IV converters for generating frequencies using a current mode controlled oscillator in accordance with a preferred exemplary embodiment of the present invention. As shown in FIG. 9, a current mirror 905 provides a bias current input source for each of first oscillator stage 910, second oscillator stage 930, third oscillator stage 950, first current voltage converter 920, second current voltage converter 940, and third current voltage converter 960. Current mirror 905 is designed to copy a current through one active device by controlling the current in another active device of a circuit, keeping the output current constant regardless of loading. The current being "copied" can be, and sometimes is, a varying signal current. Current mirror 905 is used to provide bias currents and active loads to circuits such as circuit 900.

Additionally, the output of first oscillator stage 910 is provided as an input to second oscillator stage 930. Similarly, the output of second oscillator stage 930 is provided as an input to third oscillator stage 950 and the output of third oscillator stage 950 is provided as an input to first oscillator stage 910. This is a ring type topography.

Further, as previously explained, the output of first oscillator stage 910, second oscillator stage 930, and third oscillator stage 950, provide inputs to first current voltage converter 920, second current voltage converter 940, and third current voltage converter 960, respectively. This provides a digital output signal from each of the current voltage converters, output 970, output 980, and output 990.

The most preferred embodiments of the present invention, particularly as shown in FIG. 9, decrease the oscillator output dependency upon process, voltage, and temperature. The process causes minor changes due to the change in load capacitance, but does not change the gain for each stage. Since the most preferred embodiments of the present use a current mirror circuit to provide the input, changes in voltage only minimally affect the circuit. The gain of the circuit does not change with temperature, nor does the load capacitance.

Using the P-channel version as an example, the impedance between ground and the oscillation signals is very high (current mirror output stage). On the other hand, the diode-connected transistor to power has a significantly lower impedance when not operating in cutoff. Thus a very high Power Supply Rejection Ratio (PSRR) to ground is maintained. This is in stark contrast to the presently know approaches with impedance ratios that "share" the noise generated between power and ground, causing jitter issues.

Additionally N-Channel versions of frequency generation circuits in accordance with the preferred embodiments of the present invention exhibit desirable characteristics including high impedance to power and lower impedance to ground.

From the foregoing description, it should be appreciated that the systems and methods for frequency generation disclosed herein presents significant benefits that would be apparent to one skilled in the art. Furthermore, while multiple embodiments have been presented in the foregoing description, it should be appreciated that a vast number of variations in the embodiments exist. For example, although most example use n-channel devices for the control current and p-channel devices to provide the gain, those skilled in the art will recognize that the circuit can be implemented just as easily with p-channel control current and n-channel gain.

Lastly, it should be appreciated that these embodiments are preferred exemplary embodiments only and are not intended to limit the scope, applicability, or configuration of the invention in any way. Rather, the foregoing detailed description provides those skilled in the art with a convenient road map for implementing a preferred exemplary embodiment of the invention, it being understood that various changes may be made in the function and arrangement of elements described in the exemplary preferred embodiment without departing from the spirit and scope of the invention as set forth in the appended claims.

The invention claimed is:

1. A multi-stage oscillator comprising:
a plurality of oscillator stages, comprising:
a first oscillator stage, the first oscillator stage comprising a first current mirror amplifier having a first gain, the first current mirror amplifier comprising a first current reference, a first current input, and a first current output, wherein the first current reference is coupled to an equal bias current that controls the first current mirror amplifier,
a second oscillator stage, the second oscillator stage comprising a second current mirror amplifier having the first gain, the second current mirror amplifier comprising a second current reference, a second current input, and a second current output, wherein the second current input is coupled to the first current output, and wherein the second current reference is coupled to the equal bias current that controls the second current mirror amplifier, and
a third oscillator stage, the third oscillator stage comprising a third current mirror amplifier having the first gain, the third current mirror amplifier comprising a third current reference, a third current input, and a third current output, wherein the third current input is coupled to the second current output, wherein the third current output is coupled to the first current input, and wherein the third current reference is coupled to the equal bias current that controls the third current mirror amplifier; and
at least one current voltage converter receiving the equal bias current, the at least one current voltage converter having a second gain, wherein at least one of the plurality of oscillator stages is coupled to the at least one current to voltage converter, wherein the at least one current to voltage converter provides a digital output signal.

2. The multi-stage oscillator of claim 1 wherein the equal bias current is generated using P-Channel type transistors.

3. The multi-stage oscillator of claim 1 wherein the equal bias current is generated using N-Channel type transistors.

4. The multi-stage oscillator of claim 1 further comprising a load coupled to the digital output signal provided by the at least one current to voltage converter.

5. The multi-stage oscillator of claim 1 wherein the plurality of oscillator stages comprises three oscillator stages and the at least one current voltage converter comprises three current voltage converters, wherein each of the three current voltage converters is coupled to one of the three oscillator stages, wherein each of the three current voltage converters provides a digital output signal.

6. The multi-stage oscillator of claim 5 further comprising a load coupled to the digital output signal from each of the three current to voltage converters.

7. The multi-stage oscillator of claim 1 wherein the plurality of oscillator stages comprises five oscillator stages and the at least one current voltage converter comprises five current voltage converters, wherein each of the five current voltage converters is coupled to one of the five oscillator stages, and wherein each of the five current voltage converters provides a digital output signal.

8. The multi-stage oscillator of claim 7 further comprising a load coupled to the digital output signal from each of the five current to voltage converters.

9. The multi-stage oscillator of claim 1, wherein a waveform of the digital output signal is defined based at least in part on the first gain and the second gain.

10. A method of generating a oscillating signal comprising the steps of:
supplying an equal bias current to a plurality of oscillator stages, the plurality of oscillator stages comprising:
a first oscillator stage, the first oscillator stage comprising a first current mirror amplifier having a first gain, the first current mirror amplifier comprising a current reference, a first current input, and a first current output, wherein the first current reference is coupled to the equal bias current,
a second oscillator stage, the second oscillator stage comprising a second current mirror amplifier having the first gain, the second current mirror amplifier comprising a second current reference, a second current input, and a second current output, wherein the second current input is coupled to the first current output, and wherein the second current reference is coupled to the equal bias current, and
a third oscillator stage, the third oscillator stage comprising a third current mirror amplifier having the first gain, the third current mirror amplifier comprising a third current reference, a third current input, and a third current output, wherein the third current input is coupled to the second current output, wherein the third current output is coupled to the first current input, and wherein the third current reference is coupled to the equal bias current; and supplying the equal bias current to at least one current voltage converter having a second gain;

supplying a signal from at least one of the plurality of oscillator stages to the at least one current voltage converter;

and generating a digital output signal from the at least one current voltage converter.

11. The method of claim 10 wherein the wherein the equal bias current is generated using P-Channel type transistors.

12. The method of claim 10 wherein the wherein the equal bias current is generated using N-Channel type transistors.

13. The method of claim 10 wherein a load is coupled to the at least one digital output signal from each of the at least one current voltage converter.

14. The method of claim 10 wherein supplying an equal bias current to the plurality of oscillator stages comprises supplying an equal bias current to a plurality of oscillator stages from a current mirror.

15. The method of claim 10 wherein the plurality of oscillator stages comprises three oscillator stages.

16. The method of claim 10 wherein the plurality of oscillator stages comprises three oscillator stages and the at least one current voltage converter comprises three current voltage converters, wherein each of the three current voltage converters is coupled to one of the three oscillator stages, wherein each of the three current voltage converters provides a digital output signal.

17. The method of claim 16 wherein a load is coupled to the digital output signal from each of the three current voltage converters.

18. The method of claim 10 wherein the plurality of oscillator stages comprises five oscillator stages and the at least one current voltage converter comprises five current voltage converters, wherein each of the five current voltage converters is coupled to one of the five oscillator stages, and wherein each of the five current voltage converters provides a digital output signal.

19. A multi-stage oscillator comprising:

a first oscillator stage, the first oscillator stage comprising a first current mirror amplifier having a first gain, the first current mirror amplifier comprising a first current reference, a first current input, and a first current output, wherein the first current reference is coupled to a control current;

a second oscillator stage, the second oscillator stage comprising a second current mirror amplifier having the first gain, the second current mirror amplifier comprising a second current reference, a second current input, and a second current output, wherein the second current input is coupled to the first current output, and wherein the second current reference is coupled to the control current;

a third oscillator stage, the third oscillator stage comprising a third current mirror amplifier having the first gain, the third current mirror amplifier comprising a third current reference, a third current input, and a third current output, wherein the third current input is coupled to the second current output, wherein the third current output is coupled to the first current input, and wherein the third current reference is coupled to the control current;

a first current voltage converter having a second gain, wherein the first current voltage converter is coupled to the first current output of the first oscillator stage;

a second current voltage converter having a second gain, wherein the second current voltage converter is coupled to the second current output of the second oscillator stage;

a third current voltage converter having a second gain, wherein the third current voltage converter is coupled to the third current output of the third oscillator stage;

a first output signal provided by the first current voltage converter;

an optional second output signal provided by the second current voltage converter; and an optional third output signal provided by the third current voltage converter.

\* \* \* \* \*